United States Patent
Stella et al.

(10) Patent No.: US 9,237,644 B2
(45) Date of Patent: Jan. 12, 2016

(54) MANUFACTURING OF A HEAT SINK BY WAVE SOLDERING

(71) Applicant: STMicroelectronics S.r.l., Agrate Brianza (IT)

(72) Inventors: Cristiano Gianluca Stella, San Gregorio di Catania (IT); Rosalba Cacciola, Tremestrieri Etneo (IT); Giuseppe Luigi Malgioglio, Catania (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 175 days.

(21) Appl. No.: 14/225,625

(22) Filed: Mar. 26, 2014

(65) Prior Publication Data

US 2014/0301042 A1     Oct. 9, 2014

(30) Foreign Application Priority Data

Apr. 5, 2013 (IT) .............................. MI2013A0520

(51) Int. Cl.
| | |
|---|---|
| *B23K 31/02* | (2006.01) |
| *H05K 1/02* | (2006.01) |
| *B23K 1/08* | (2006.01) |
| *B23K 1/00* | (2006.01) |
| *H01L 23/367* | (2006.01) |
| *H05K 13/04* | (2006.01) |

(52) U.S. Cl.
CPC ............ *H05K 1/0204* (2013.01); *B23K 1/0016* (2013.01); *B23K 1/085* (2013.01); *H01L 23/3677* (2013.01); *H05K 13/0465* (2013.01); *H01L 2224/13* (2013.01); *H01L 2924/13091* (2013.01); *H05K 2201/066* (2013.01)

(58) Field of Classification Search
None
See application file for complete search history.

(56) References Cited

U.S. PATENT DOCUMENTS

| | | | | | |
|---|---|---|---|---|---|
| 4,254,447 | A | * | 3/1981 | Griffis .................. | H01L 23/3672 174/16.3 |
| 4,321,423 | A | * | 3/1982 | Johnson .............. | H01L 23/4006 174/16.3 |
| 4,521,827 | A | * | 6/1985 | Jordan ................ | H01L 23/4006 165/80.1 |
| 4,535,385 | A | * | 8/1985 | August .................. | H01L 23/36 257/E23.101 |
| 4,544,942 | A | * | 10/1985 | McCarthy ........... | H01L 23/4093 174/16.3 |
| 4,720,771 | A | * | 1/1988 | Horton ................ | H01L 23/4006 165/185 |
| 4,736,273 | A | * | 4/1988 | Vertongen ......... | H01L 23/49562 174/16.1 |
| 4,792,939 | A | * | 12/1988 | Hikita ...................... | H04B 1/50 370/277 |
| 4,888,637 | A | * | 12/1989 | Sway-Tin ........... | H01L 23/4006 174/252 |

(Continued)

FOREIGN PATENT DOCUMENTS

| | | |
|---|---|---|
| DE | 19736962 A1 | 3/1999 |
| EP | 0920055 A2 | 6/1999 |

OTHER PUBLICATIONS

Italian Search Report and Written Opinion for IT MI2013A000520 mailed Jan. 20, 2014 (7 pages).

*Primary Examiner* — Kiley Stoner
(74) *Attorney, Agent, or Firm* — Gardere Wynne Sewell LLP

(57) ABSTRACT

An electronic device is attached to a first surface of a board which includes vias. A heat sink precursor for the electronic device is attached to the second surface of the electronic board. The heat sink precursor includes a cavity facing the vias. A wave of solder paste is applied to the second surface. The solder paste penetrates into the cavity of the heat sink precursor and flows by capillary action through the vias to weld a thermal radiator and/or electronic contact of the electronic device to the vias. The solder paste further remains in the cavity to form a corresponding heat sink.

12 Claims, 9 Drawing Sheets

(56) References Cited

U.S. PATENT DOCUMENTS

| | | | | |
|---|---|---|---|---|
| 5,615,087 A * | 3/1997 | Wieloch | H01L 23/36 | 174/535 |
| 5,616,888 A * | 4/1997 | McLaughlin | H05K 1/183 | 174/252 |
| 5,739,586 A * | 4/1998 | Cannizzaro | H01L 23/3677 | 257/706 |
| 5,830,014 A * | 11/1998 | Lwee et al. | B23K 1/0016 | 228/39 |
| 6,164,636 A * | 12/2000 | Taylor | H05K 13/0069 | 269/287 |
| 6,203,191 B1 * | 3/2001 | Mongan | G01K 7/42 | 374/20 |
| 6,233,159 B1 * | 5/2001 | Harman | H01L 23/367 | 174/16.3 |
| 6,237,832 B1 * | 5/2001 | Chung | B23K 3/087 | 228/37 |
| 9,012,787 B2 * | 4/2015 | Stella | H05K 3/3468 | 174/255 |
| 2003/0011997 A1 * | 1/2003 | Hsieh | H01L 23/40 | 361/708 |
| 2003/0034381 A1 * | 2/2003 | Nakatsuka | B23K 1/085 | 228/180.1 |
| 2004/0124517 A1 * | 7/2004 | Hsieh | H01L 23/42 | 257/686 |
| 2004/0238211 A1 * | 12/2004 | Momokawa | H05K 1/0201 | 174/260 |
| 2004/0264135 A1 * | 12/2004 | MacGregor | H01L 23/40 | 361/704 |
| 2005/0061850 A1 * | 3/2005 | Buley | B23K 1/0016 | 228/37 |
| 2005/0160568 A1 * | 7/2005 | Fisher | H01L 23/4093 | 24/543 |
| 2005/0264998 A1 * | 12/2005 | McCutcheon | H01L 23/4006 | 361/702 |
| 2008/0239678 A1 * | 10/2008 | Ploeg | H01L 23/40 | 361/719 |
| 2008/0266811 A1 * | 10/2008 | Yamada | F24F 1/12 | 361/720 |
| 2008/0307643 A1 * | 12/2008 | Sozansky | H01L 23/42 | 29/839 |
| 2013/0050954 A1 * | 2/2013 | Albrecht, III | H05K 1/0203 | 361/720 |
| 2013/0126590 A1 * | 5/2013 | Privitera | H05K 3/3431 | 228/170 |
| 2015/0014394 A1 * | 1/2015 | Ling | B23K 3/0653 | 228/37 |
| 2015/0319886 A1 * | 11/2015 | Albrecht, III | H05K 7/20463 | 361/709 |

* cited by examiner

MANUFACTURING OF A HEAT SINK BY WAVE SOLDERING

PRIORITY CLAIM

This application claims priority from Italian Application for Patent No. MI2013A000520 filed Apr. 5, 2013, the disclosure of which is incorporated by reference.

TECHNICAL FIELD

The solution according to one or more embodiments of the present invention refers to the field of electronics. In greater detail, the solution according to one or more embodiments of the present invention relates to wave soldering.

BACKGROUND

Numerous assembly processes for electronic assemblies suitable for large-scale production are widespread in the art. Substantially, each assembly process provides for mounting one or more electronic devices onto an electronic board (e.g., a Printed Electronic board or PCB). Typically, each electronic device comprises one (or more than one) chip of semiconductor material on which an actual electronic component (or an electronic microcircuit) is integrated. The chip is encapsulated in an insulating package to be insulated and protected from the external environment. The package exposes conductive pins, which are coupled with corresponding terminals of the chip. The pins of the package are welded to conductive tracks formed on an insulating substrate of the electronic board. This allows the interaction between the electronic component and other electronic devices, mounted on the electronic board in a similar manner, through the tracks suitably connected among them.

For example, a known welding technique is the wave soldering technique. In this case, the electronic devices are initially glued onto the electronic board by means of an adhesive paste, so that the pins of the electronic device correspond to welding regions of the tracks of the electronic board. Subsequently, the assembly thus obtained is arranged above a bath of molten solder paste, with a surface of the electronic board (on which the electronic devices are glued) facing downwards. The assembly is then flooded with a wave of molten solder paste, which brushes the electronic board so as to bind to the welding regions of the electronic board thereby welding the pins of the electronic devices thereto (without affecting the rest of the assembly made of insulating material).

The wave soldering technique described above, however, may be problematic with certain types of electronic devices. For example, this may occur in the case of electronic devices in Surface-Mount Technology or SMT, and in particular in the case of electronic devices known in the art with the name of "No-Lead" or "Micro-Lead", in which the pins are made by conductive areas exposed on a mounting surface of the package of the electronic device for the mounting on the electronic board. Indeed, a gap that is formed after the gluing of the package, between the pins of these electronic devices and the welding regions, may be too narrow to allow the wave of solder paste to penetrate optimally—in particular, in case of pins with a relatively large surface.

In addition, the operating temperature of the electronic component (especially if of small size and/or high power) may be very high and this may reduce the performance of the electronic component, possibly up to a breakage thereof or in any case reducing its useful life.

In the art it is known to provide a heat sink (or more) connected to the chip and facing the mounting surface of the package so as to dissipate the heat onto the electronic board on which the electronic device is mounted. Furthermore, it is known to thermally connect a heat sink (or more) to the electronic device, so as to facilitate an exchange of heat with the external environment. Typically, the heat sink is connected to the electronic device after the latter has been mounted onto the electronic board; for example, the heat sink is glued directly to the package, or it is welded and/or screwed to the electronic board thereunder.

However, this requires a dedicated mounting operation of the heat sink, which entails a number of additional steps in a manufacturing process of such electronic assemblies, and requires corresponding machinery and/or technicians to perform them, with a consequent increase of the manufacturing cost thereof.

SUMMARY

In general terms, the solution according to one or more embodiments is based on the idea of providing each heat sink contextually with the welding of the corresponding electronic device.

More specifically, an aspect of a solution according to an embodiment provides a method for producing an electronic assembly, in which a heat sink precursor for each electronic device is attached to an electronic board with a cavity thereof facing (one or more) corresponding vias, in such a way that a wave of solder paste that penetrates through at least one opening of the heat sink precursor in the corresponding cavity welds the heat sink precursor to the vias for forming a corresponding heat sink.

Another aspect of a solution according to an embodiment provides a corresponding electronic assembly.

A further aspect of a solution according to an embodiment provides a complex electronic system comprising a plurality of such electronic assemblies.

BRIEF DESCRIPTION OF THE DRAWINGS

The solution according to one or more embodiments, as well as additional features and its advantages, will be better understood with reference to the following detailed description, given purely by way of an indication and without limitation, to be read in conjunction with the attached figures (wherein corresponding elements are denoted with equal or similar references and their explanation is not repeated for the sake of brevity). In this respect, it is expressly understood that the figures are not necessarily to scale (with some details that may be exaggerated and/or simplified) and that, unless otherwise indicated, they are simply used to conceptually illustrate the described structures and procedures. In particular.

DETAILED DESCRIPTION OF THE DRAWINGS

With particular reference to FIGS. 1A-1D, there is shown the main steps of a manufacturing method of an electronic assembly according to an embodiment.

Figure 1A:
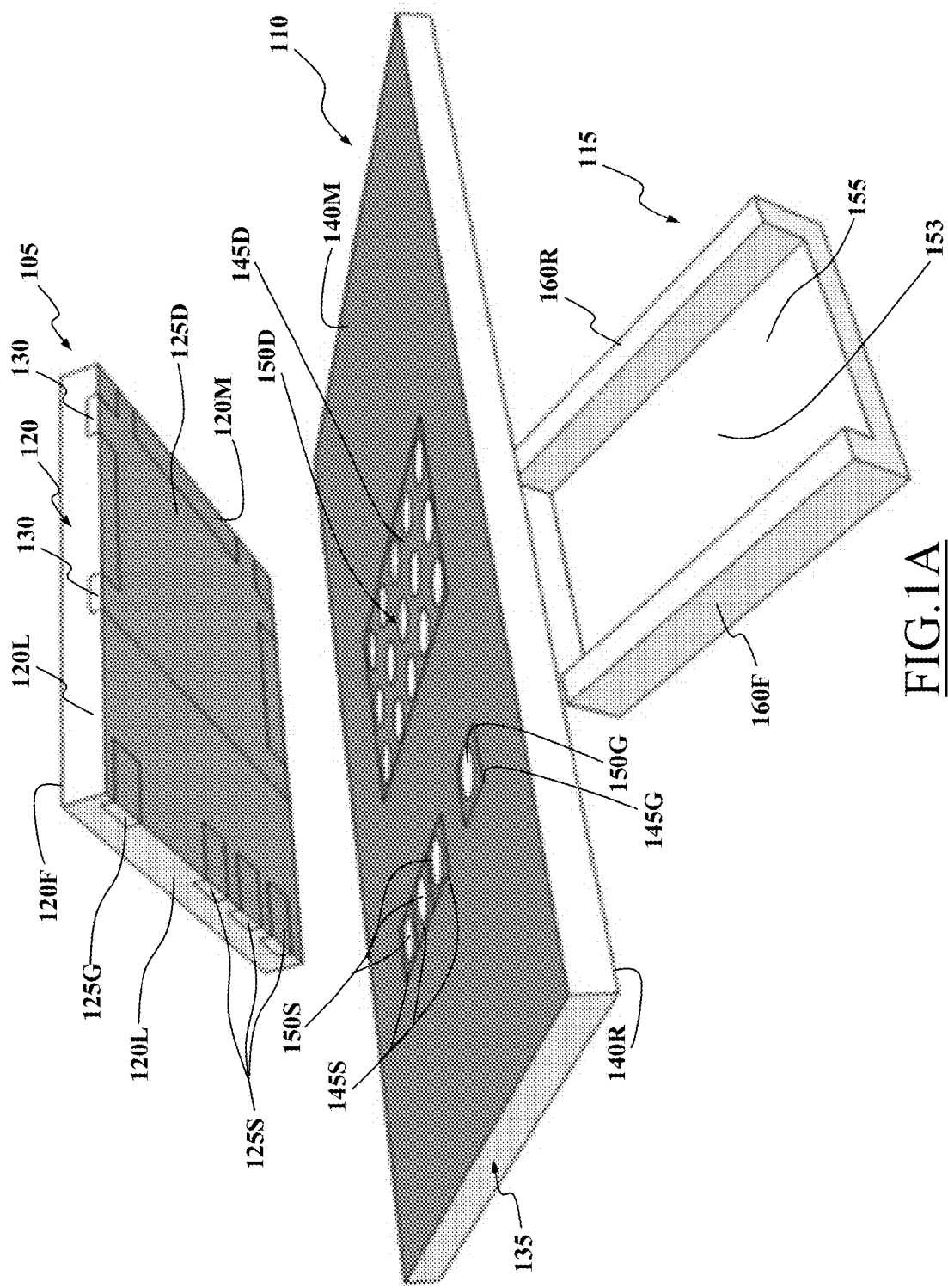
FIGS. 1A-1D show the main steps of a manufacturing method of an electronic assembly according to an embodiment.

Starting from FIG. 1A, for this purpose an electronic device 105 (or more), an electronic board 110 (of which only a portion is shown in the figures), and a heat sink precursor 115 for each electronic device 105 are provided.

In the example at issue, the electronic device 105 is of the SMT Micro-Lead type. In particular, the electronic device 105 comprises a package 120 formed by a body of electrically insulating material (e.g., plastic, epoxy resin or ceramic) with a substantially parallelepiped shape. The package 120 has two main surfaces, namely a mounting surface 120M (for the mounting on the electronic board 110) and a free surface 120F opposite thereto; the mounting surface 120M and the free surface 120F are separated by four side surfaces 120L.

The package 120 has the purpose of protecting and insulating, from the outside environment, a chip of semiconductor material (or more), not visible in the figure, on which an electronic component or an electronic microcircuit is integrated—for example, a MOS power transistor. In order to realize an electrical path between the chip and elements external to the electronic device 105—thereby allowing connecting the electronic component to other electronic devices not shown in the figure—various pins are exposed from the package 120—for example, three source pins 125S, a gate pin 125G and a drain pin 125D in the case of the MOS transistor; the pins 125S, 125G, 125D are formed of electrically conductive material (e.g., a metal such as aluminum) and are in electrical contact with corresponding terminals of the chip, for example, through respective bonding wires (not shown in the figure). The source pins 125S and the gate pin 125G are generally of rectangular shape, and are exposed partly on the mounting surface 120M and partly on one of the side surfaces 120L of the package 120. Conversely, the drain pin 125D is exposed only on the mounting surface 120M; the drain pin 125D has a generally rectangular shape, and extends over approximately one half of the mounting surface 120M. The drain pin 125D also defines a surface exposed from the package 120 of a radiator (not visible in the figure) connected to the chip for dissipating the heat produced by it during operation. A plurality of tie-bars 130 (used to support the radiator during the realization of the package 120, and thus electrically connected thereto) protrude, for example, in pairs, on each side surface 120L of the package 120, excluding the side surface on which the pins 125S and 125G extend.

The electronic board 110 is, for example, a printed electronic board (PCB). The electronic board 110 comprises a substrate 135 of an electrically insulating material (e.g., FR-4 comprising glass fiber and epoxy resin). The substrate 135 is provided with a first (or front) main surface 140M, on which the electronic device 105 will be mounted, and a second (or rear) main surface 140R opposite thereto, on which the heat sink precursor 115 will be mounted (as described below).

A plurality of welding regions 145S, 145G and 145D (or lands) of electrically conductive material (e.g., copper) are formed on the front surface 140M for welding the pins 125S, 125G and 125D, respectively, of the electronic device 105 (as described in the following). Typically, the electronic board 110 also comprises tracks of electrically conductive material (e.g., again copper), not shown in the figure for the sake of simplicity, which electrically connect together the welding regions of more electronic devices mounted on the electronic board 110, and then the electronic devices themselves.

One or more through holes covered with an electrically conductive material (e.g., still copper), are formed in correspondence to each of the welding regions 145S, 145G and 145D, in such a way to cross the electronic board 110 from the front surface 140M to the rear surface 140R. The number of through holes in each of the welding regions 145S, 145D and 145G is preferably, although not exclusively, proportional to an extension thereof. For example, a through hole 150S is formed at the center of each welding region 145S, a through hole 150G is formed at the center of the welding region 145G, and a matrix of through holes 150D (5×3=15 in the figure) is formed at the center the welding region 145D. Similar additional welding regions (not visible in the figure) are formed on the rear surface 140R in correspondence to the welding regions 145S, 145D and 145G (commonly used to solder a heat sink to the electronic board 110 or to dissipate the heat themselves).

The heat sink precursor 115 is formed of a thermally (and optionally also electrically) conductive material (e.g., aluminum). In the solution according to an embodiment, as described in the following, the heat sink precursor 115 is used to make an actual heat sink during the soldering of the electronic device 105 on the electronic board 110. For this purpose, the heat sink precursor 115 comprises a cavity 153 that faces the rear surface 140R; the cavity 153 is filled (at least in part) by a solder paste during the soldering of the electronic device 105, so as to form the desired heat sink, which is already mounted on the electronic board 110.

Such solution allows mounting both the electronic device 105 and the heat sink on the electronic board 110 by means of a single welding operation. In this way, it is possible to reduce the duration of the corresponding manufacturing process (and the required machineries and/or technicians), with a beneficial effect on the manufacturing cost.

Moreover, in this way it is possible to obtain an electronic assembly being mechanically stable and able to effectively dissipate the heat produced during the operation of the electronic device 105. In fact, a thermally conductive path from the radiator of the electronic device 105 to the heat sink is formed by the solder paste integrally—from a structural point of view and from a point of view of used material. This greatly improves the dissipation of heat from the chip inside the insulating package 120 to the external environment (compared to the known structures in which elements being distinct and/or of heterogeneous materials are used, connected to each other by means of further elements). Therefore, it is possible to achieve better thermal performance of the electronic assembly with the same size, or smaller size of the electronic assembly with equal thermal performance; in particular, in case of electronic devices of SMT Micro-Lead type, this allows maintaining the size of the heat sinks comparable to those thereof, and therefore having very compact electronic assemblies (particularly suitable to be used in electronic apparatuses of the portable type, e.g., mobile phones).

In particular, in the example at issue, the heat sink precursor 115 has, in side view, a substantially "C" like profile. In other words, the heat sink precursor 115 comprises a bottom wall 155 (substantially with rectangular shape) and two sidewalls 160F and 160R facing each other and extending transversely from the main edges (opposite to each other) of the bottom wall 155. In this way, the bottom wall 155 and the two sidewalls 160F, 160R define an empty space therebetween that forms the cavity 153. Preferably, although not exclusively, the sidewalls 160F and 160R have different heights from the bottom wall 115; in the example at issue, the height of the sidewall 160F is lower than the height of the sidewall 160R (for example, by 10-30%, preferably 15-25%, and even more preferably 18-22%, such as 20%).

Figure 1B:
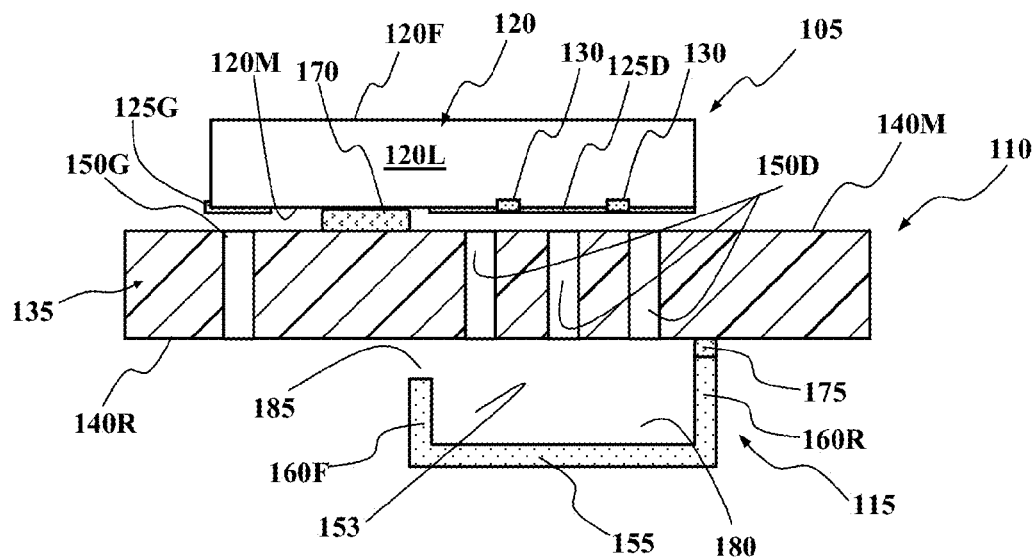

Turning to FIG. 1B, the electronic device 105 and the heat sink precursor 115 are attached to the electronic board 110.

In detail, the electronic device 105 is attached to the front surface 140M with the pins 125S, 125G and 125D facing the corresponding welding regions 145S, 145D and 145G. For this purpose, an adhesive paste 170 is placed onto the electronic board 110 in locations being not occupied by the welding regions 145S, 145G and 145D, and that will be covered (in plan view) by the mounting surface 120M of the electronic device 105 (e.g., between the welding regions 145S, 145G and the welding region 145D). The electronic device 105 is then positioned by aligning the pins 125S, 125G and 125D to the respective welding regions 145S, 145G and 145D; in this way, the adhesive paste 170 on the electronic board 110 is attached to a corresponding portion of the mounting surface 120M of the electronic device 105 comprised between the pins 125S, 125G and the pin 125D.

The heat sink precursor 115 is similarly attached to the rear surface 140R with the cavity 153 facing the through holes 150D. For this purpose, further adhesive paste 175 is placed onto a free end of the (highest) sidewall 160R. The heat sink precursor 115 is then positioned with the free end of the sidewall 160R on the rear surface 140R alongside the through holes 150D and the sidewall 160F (separated therefrom) between the through holes 150D and the through holes 150S, 150G; in this way, the bottom wall 155 faces the through holes 150D. Consequently, the cavity 153 (defined by the walls 155, 160F and 160R) is closed at the top by the rear surface 140R. The cavity 153 is still accessible through two longitudinal openings 180 aligned to each other (between the sidewalls 160F and 160R); in addition, the cavity 153 is also accessible through a side opening 185 defined by the space left free between the sidewall 160F and the rear surface 140R.

Figure 1C:
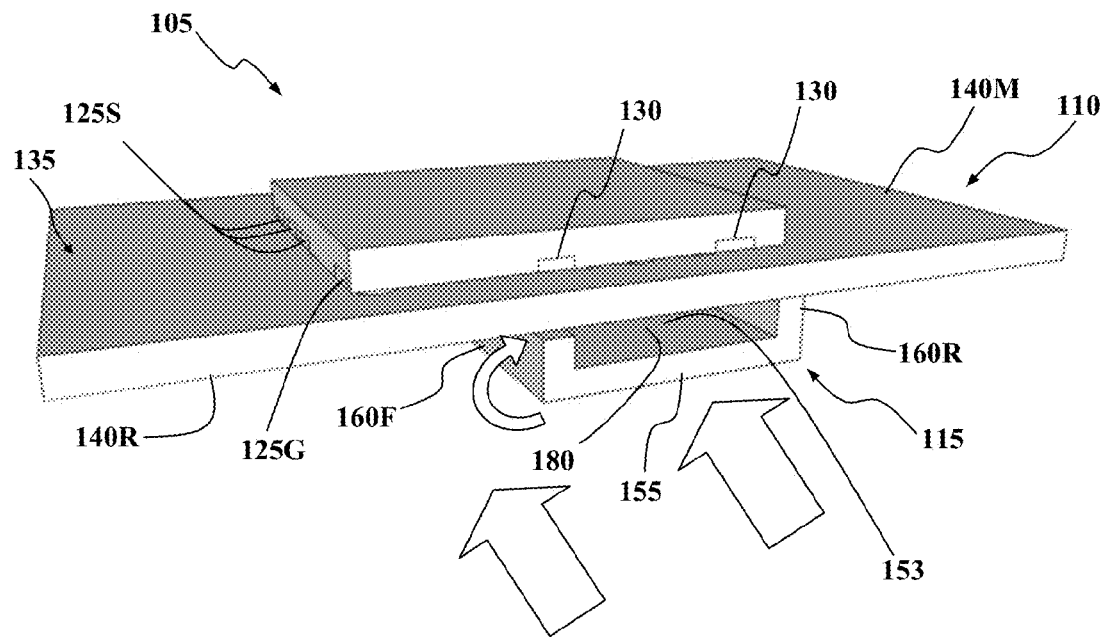

Subsequently, as shown in FIG. 1C, a precursor assembly thus obtained is subject to a wave soldering. In detail, the precursor assembly is placed into a bath of molten solder paste in liquid state (not shown in the figure) with the rear surface 140R facing downwards being immersed in this bath and the front surface 140M facing upwards being above a free surface of the bath. The precursor assembly is flooded by a wave of solder paste (which in the figure is illustrated in a conceptual manner by means of arrows) at the rear surface 140R.

The wave of solder paste floods the precursor assembly propagating along a propagation direction parallel to the sidewalls 160F and 160R (in the case of more heat sink precursors 115, all are arranged with the sidewalls 160F, 160R parallel to each other along a common direction). Consequently, an amount of solder paste penetrates into the cavity 153 through the longitudinal opening 180 that is encountered first in a propagation direction of the wave of solder paste (in front in the figure), and in addition through the side opening 185. The "C" conformation of the heat sink precursor 115 facilitates the conveyance of the solder paste into the cavity 153; moreover, the side opening 185 further enhances the penetration of the solder paste into the cavity 153. In this way, the solder paste wets and binds to the walls 155, 160F and 160R.

Furthermore, part of the solder paste penetrated in the cavity 153, thanks to the known phenomenon of capillarity, ascends upwards thereby filling the through holes 150D (wetting their inner surface and binding thereto), up to overflow onto the front surface 140M. In a similar way, an amount of solder paste that brushes the rear surface 140R in correspondence of the through holes 150S and 150G ascends the latter by capillarity, fills them and overflows onto the front surface 140M.

For this purpose, the through holes 150S, 150G, 150D are sized so as to ensure that the solder paste reaches the main surface 140M. In particular, a diameter 2r of the through holes 150S, 150G, 150D is determined by the known capillarity relationship:

$$h <= \frac{4\gamma\cos\theta}{\rho g 2r},$$

where ρ is the density of the (molten) solder paste, h is the thickness of the substrate 135, γ is the surface tension of the solder paste, θ is the angle between the tangent to the surface of the solder paste in the point of contact with an inner wall of the through holes 150S, 150G and 150D and the inner wall itself (taking into account the known surface tension effect), and g is the constant of gravity acceleration (approximately 9.81 m/s$^2$). For example, when the substrate 135 has a thickness h between 1 mm and 1.6 mm it is possible to have through holes with diameter 2r comprised between 0.3 mm and 1.5 mm, for example, 0.5 mm, by using common welding pastes.

Once ascended up to reach the front surface 140M, the solder paste wets the pins 125S, 125D and 125G and binds thereto and to the welding regions 145S, 145D and 145G. In this way, the wave of solder paste may reach and bind uniformly to every portion of the pins 125G, 125S, 125D even when a gap between the pins 125G, 125S, 125D and the corresponding welding regions 145G, 145S, 145D is narrow (particularly, in case of the drain pin 125D with wider surface). Therefore, this allows using the wave soldering technique even in the case of electronic devices of the SMT type, and in particular of the Micro-Lead type.

Figure 1D:
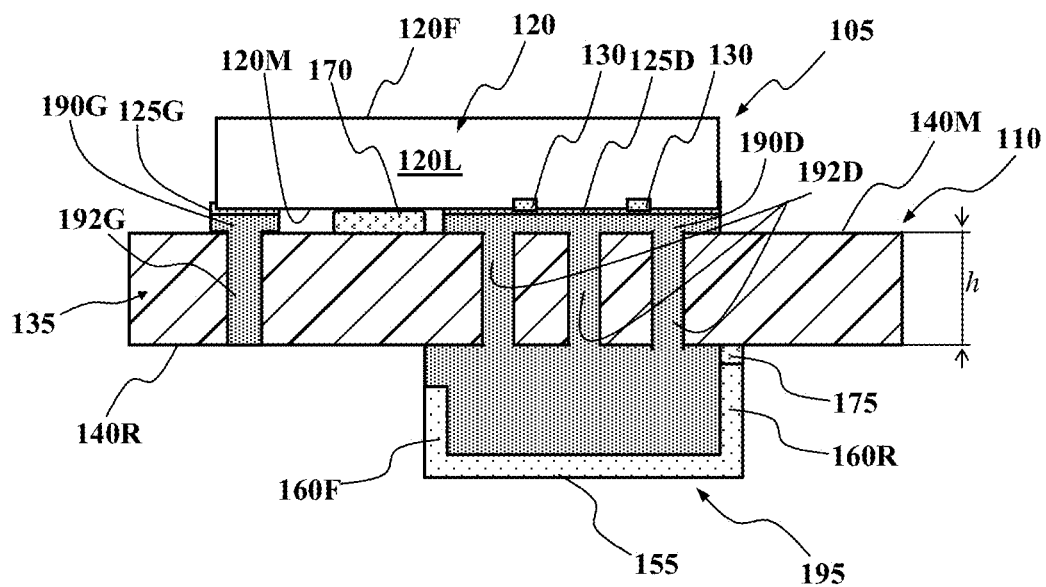

By referring now to FIG. 1D, the precursor assembly is removed from the bath of molten solder paste, and it is cleaned in order to remove the solder paste in excess (not bound to its conductive parts) in correspondence to its insulating parts (i.e., the substrate 135 and the insulating body 120). The solder paste is then cooled so as to harden, thereby soldering the electronic device 105 and the heat sink precursor 115 to the electronic board 110, in order to form the desired electronic assembly.

In detail, the solder paste on the front surface 140M welds the pins 125S, 125G, 125D to the corresponding welding regions 145S, 145G, 145 (only partially visible in the figure), so as to form three source contacts 190S between the source pins 125S and the welding regions 145S (not shown in figure), a gate contact 190G between the gate pin 125G and the welding region 145G, and a drain contact between 190D the drain pin 125D and the welding region 145D; such contacts 190S, 190D and 190G create an electrical, mechanical and thermal coupling between the pins 125S, 125D and 125G and the welding regions 145S, 145G and 145D, respectively. At the same time, the solidified solder paste within the through holes 150S, 150G and 150D produces corresponding thermally conductive paths (thermal vias); in particular, three source thermally conductive paths 192S are formed in the through holes 150S (not visible in the figure), a gate thermally conductive path 192G is formed in the through hole 150G and fifteen drain thermally conductive paths 192D are formed in the through holes 150D (only three of which are visible in the figure). These thermally conductive paths 192S, 192G, 192D are adapted to transfer the heat produced during operation of the electronic device 105 from its radiator to the rear surface 140R of the electronic board 115. Moreover, the solder paste solidified inside the cavity 153 fills it (totally or at least substantially—for example, for 90-95% of its volume), in such a way to form, together with the heat sink precursor 115, a single heatsink, indicated as a whole with the reference 195, which is welded to the corresponding welding region on the rear surface 140R.

Preferably, the pins 125S, 125G and 125D, the tie-bar 130, the welding regions 145S, 145G and 145D, the contacts 190S, 190G and 190D, the thermally conductive paths 192S, 192G and 192D and the heat sink 195 are designed and/or mutually positioned in such a way as to ensure that they comply with appropriate safety distances therebetween. These safety distances allow avoiding the occurrence of arc discharge or corona discharge phenomena, since these elements are biased to different voltage levels during operation of the electronic assembly. These distances comprise the so-called surface or "creepage" distance and the so-called air or "clearance" distance. In particular, for creepage distance is meant the shortest distance between two elements of the electronic device—each one biased to a different level of electric potential—measured along the surfaces of the electronic device, such that no superficial electric discharge between this pair of elements originates. Furthermore, for air distance is meant the minimum distance between two elements of the electronic device—each biased to a different level of electric potential—measured as the crow flies, such that no electric arc discharge between this pair of elements originates. Both the surface distance and the air distance are proportional to the difference between the voltages of the biased elements (e.g., with a proportionality factor between 1 mm/KV and 10 mm/KV); therefore, such distances are longer in the case of power electronic devices (given the high potential differences between their pins).

Turning now to FIGS. 2A-2D, these show the main steps of a manufacturing method of another electronic assembly according to an embodiment.

Figure 2A:
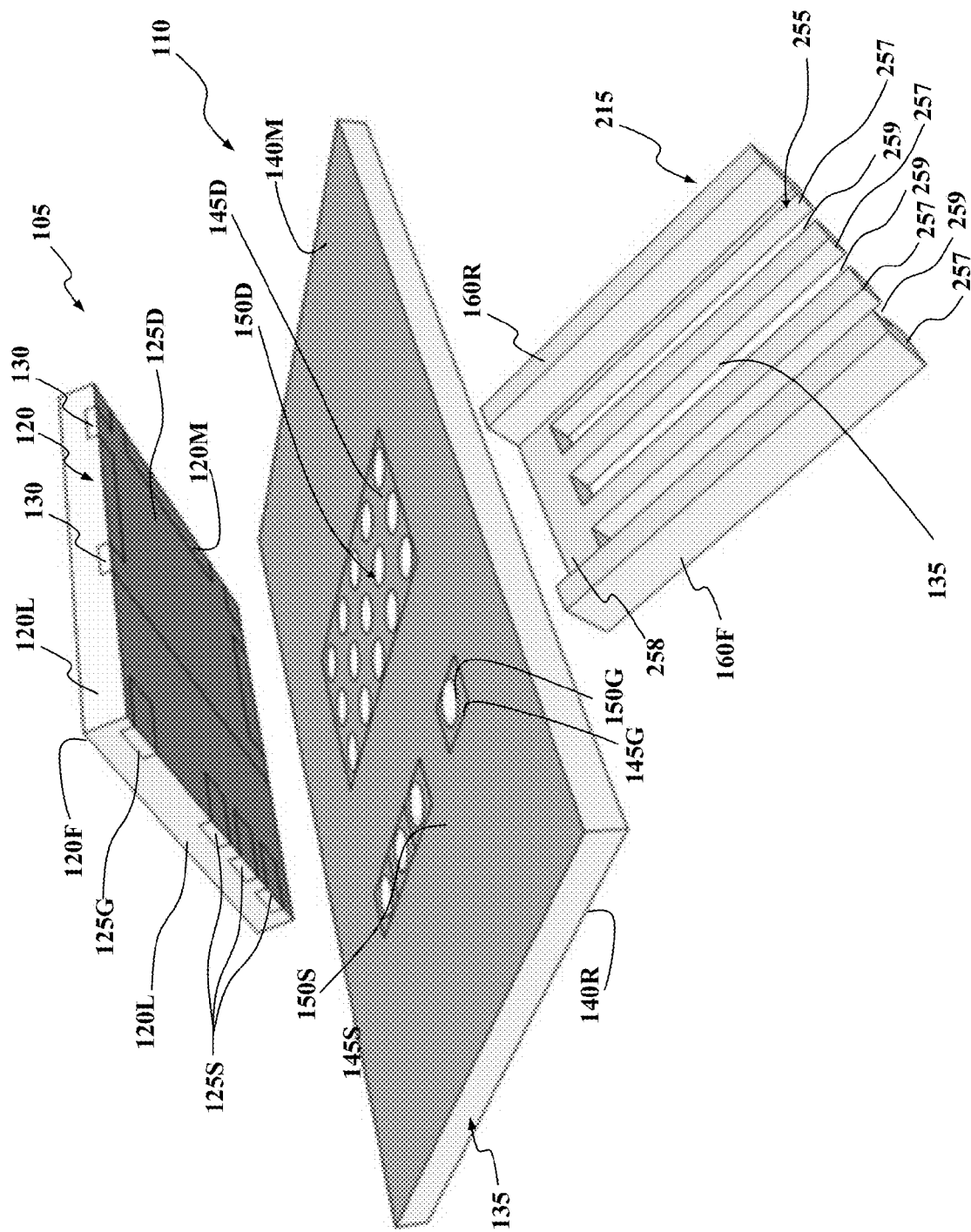
FIGS. 2A-2D show the main steps of a manufacturing method of another electronic assembly according to an embodiment.

Starting from FIG. 2A, in this case a heat sink precursor 215 is provided which differs from the heat sink precursor just described in what follows.

In this case, the bottom wall of the heat sink precursor 215 (differentiated with the reference 255) is formed with a substantially "comb-like" profile in plan view. In detail, the bottom wall is provided with a plurality of elongated elements (or prongs) 257, e.g. four in the example in the figure, substantially parallel to the sidewalls 160F and 160R, which extend transversely from a connecting element 258 that connects the sidewalls 160F, 160R between them at one end thereof (rear end in the figure). The elongated elements 257 define a slotted-hole or access slot 259 between each pair of them, which extends in the bottom wall 255 from one free edge thereof (between the sidewalls 160R, 160F) opposite the connecting element 258.

Figure 2B:
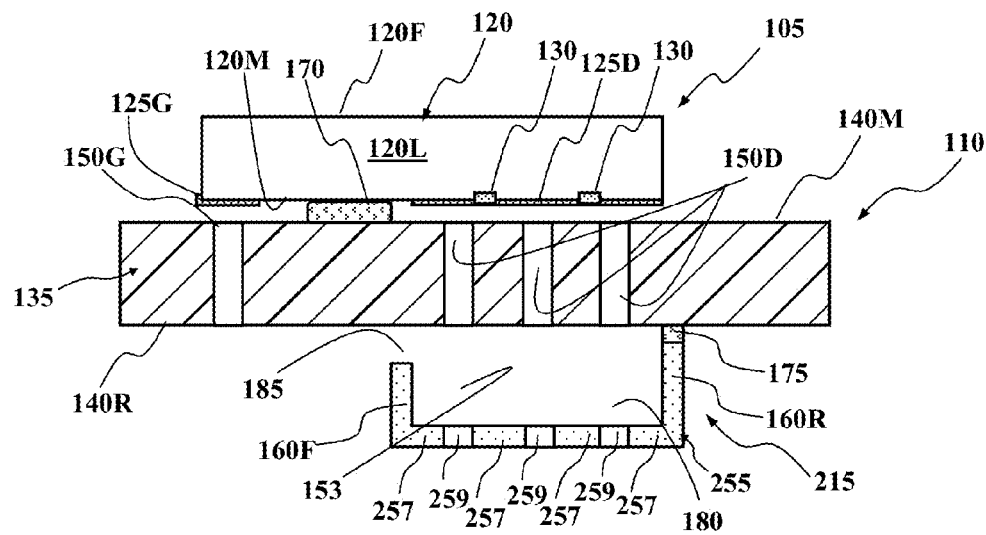

Turning to FIG. 2B, the electronic device 105 and the heat sink precursor 215 are attached to the electronic board 110 as above. The access slots 259 are each one defined in such a way to be aligned with a respective row of the array of through holes 150D. In this case, the cavity 153 is accessible (other than through the longitudinal openings 180 and the side opening 183), also through the access slots 259 at the bottom.

Figure 2C:
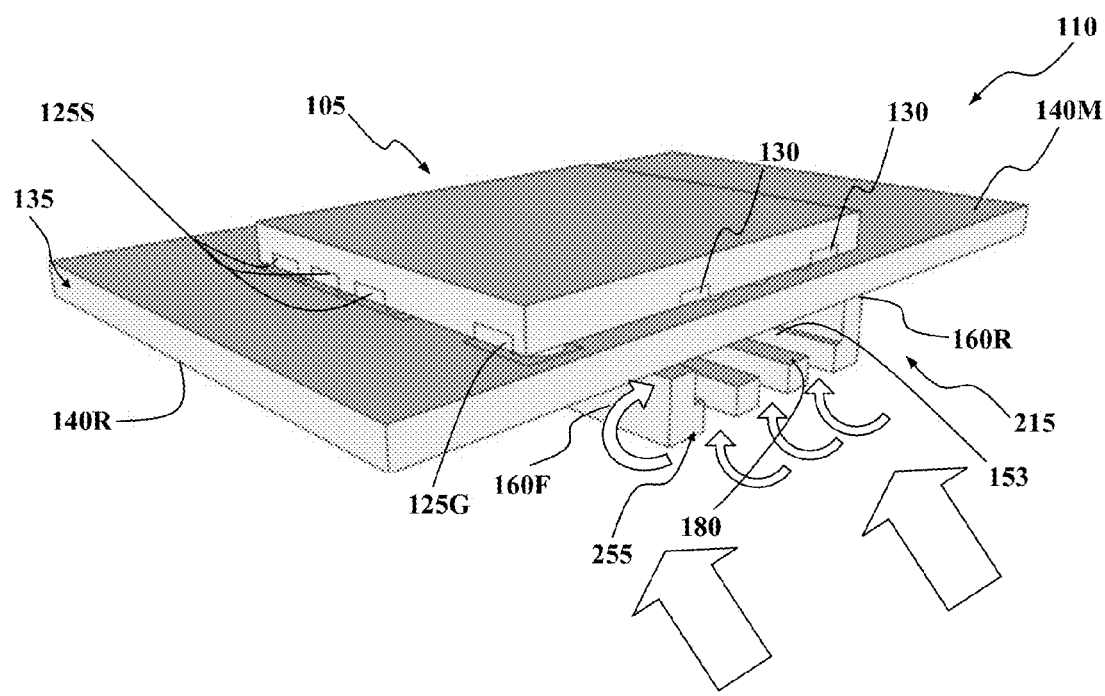

Subsequently, as shown in FIG. 2C, the precursor assembly thus obtained is subject to the wave soldering as above. In this case, a wave of solder paste propagates in a direction of propagation directed against the free edge of the heat sink precursor 215 (i.e., against the opening of the access slots 259). Therefore, the wave of solder paste penetrates inside the cavity 153 (in addition to through the longitudinal opening 180 and the side opening 185) also through the access slots 259.

In particular, the access slots 259 allow the wave of solder paste to enter the cavity 153 with a substantially zero pressure loss; accordingly, an ascending by capillarity of the through holes 150D is much more homogeneous and fast (eliminating, or at least reducing, possible mechanical defects in the welding).

Figure 2D:
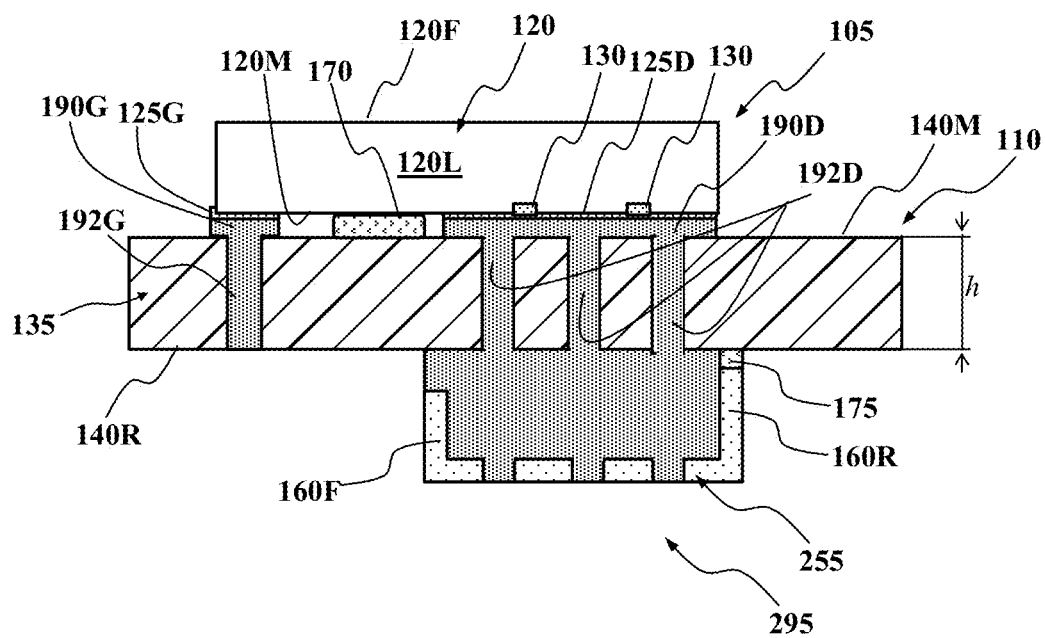

With reference now to FIG. 2D, the solder paste is then cooled as above to form a similar electronic assembly. In this case, the solder paste hardened inside the cavity 153 also fills the access slots 259, so as to form, together with the heat sink precursor 215 welded thereto, a similar single heat sink, indicated as a whole with the reference 295.

Turning now to FIGS. 3A-3D, they show the main steps of a manufacturing method of an electronic assembly according to another embodiment.

The electronic assembly and its manufacturing method differ from the electronic assemblies previously described in relation to FIGS. 1A-1C in what follows.

Figure 3A:
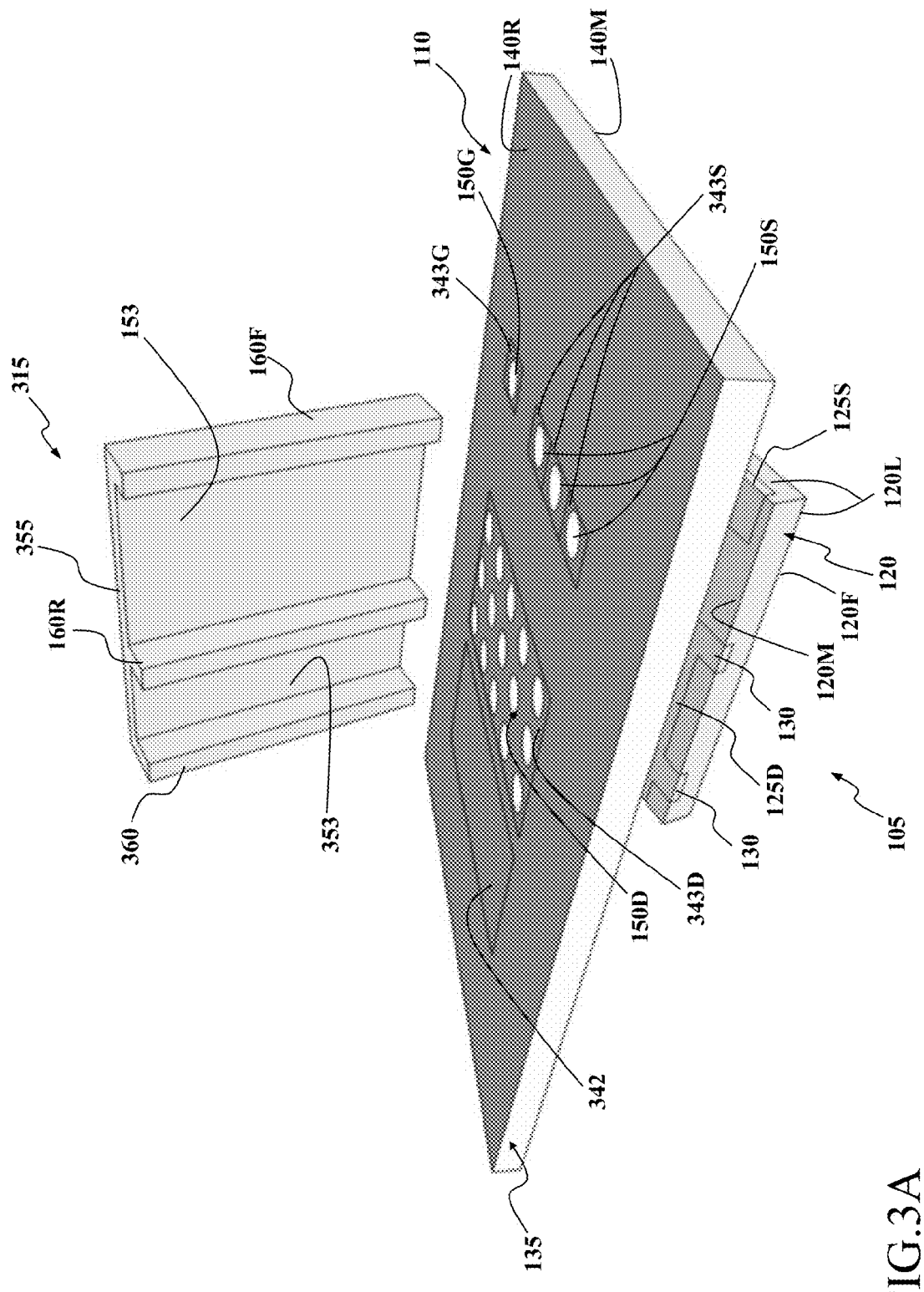
FIGS. 3A-3D show the main steps of a manufacturing method of another electronic assembly according to an embodiment.

Starting from FIG. 3A, the electronic board (differentiated with the reference 310) comprises an additional welding region 342 on the rear surface 140R, next to the welding region around the holes 150D on the rear surface 140R (indicated by the reference 343D), on the opposite side with respect to the welding regions around the through holes 150S and 150G on the rear surface 140R (indicated with the reference 343S and 343G, respectively). For example, the welding region 342 has a substantially rectangular shape, and an extent similar to that of the welding region 343D.

The heat sink precursor (differentiated with the reference 315) comprises an additional cavity 353 facing the rear surface 340R and adjacent to the cavity 153. In particular, in the example at issue, the heat sink precursor 315 has, in side view, substantially an "E" like profile. In other words, the heat sink precursor 315 comprises a bottom wall (differentiated with the reference 355) that extends beyond the sidewall 160R. A (third) sidewall 360 is formed facing the sidewall 160R and extending transversely from a free edge of the bottom wall 355 (so that the sidewall 160R is placed between the sidewall 160F and the sidewall 360). In this way, the bottom wall 355 and the three sidewalls 160F, 160R and 360 define among them (in addition to the cavity 153 between the bottom wall 355 and the sidewalls 160F and 160R) also a further cavity 353 among the bottom wall 355 and the sidewalls 360 and 160R. Preferably, although without limitation, the sidewall 360 has a height from the bottom wall 355 equal to that of the sidewall 160R.

Figure 3B:
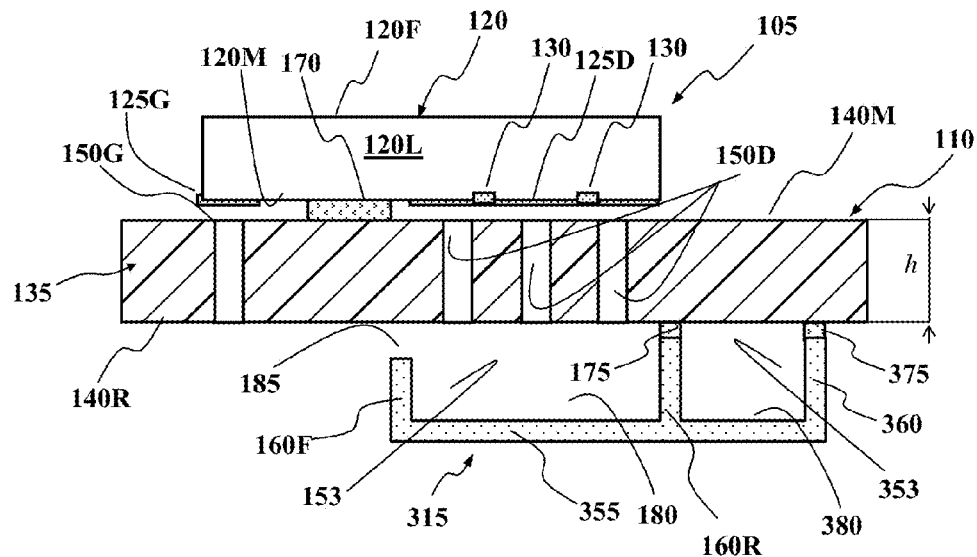

Turning to FIG. 3B, the electronic device 305 and the heat sink precursor 315 are attached to the electronic board 310 as above. In this case, the heat sink precursor 315 is attached to the rear surface 140R with the cavity 153 facing the through holes 350D and the cavity 353 facing the welding region 342. The adhesive paste 175 is also placed onto a free end of the sidewall 360 (in addition to the free end of the sidewall 160R). Consequently, also the cavity 353 is closed at the top by the rear surface 140R; the cavity 353 is still accessible through two similar longitudinal openings 380 aligned with each other (between the sidewalls 160R and 360).

Figure 3C:
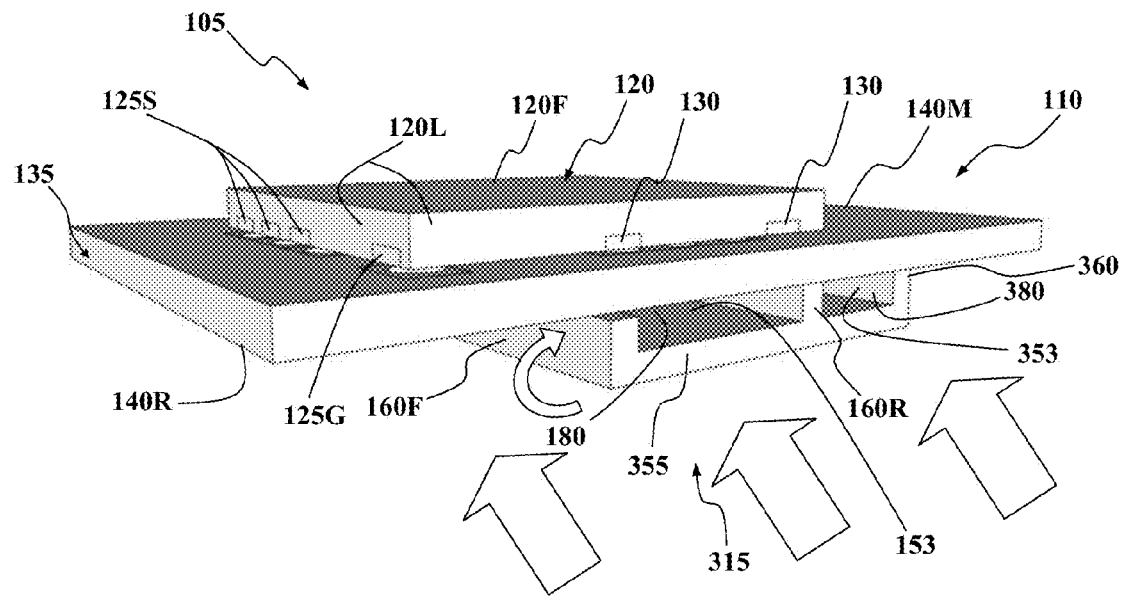

Subsequently, as shown in FIG. 3C, the precursor assembly thus obtained is subject to the wave soldering as above. In this case, an amount of solder paste in addition penetrates into the cavity 353 through the corresponding longitudinal opening 380 that is encountered first in the direction of propagation of the wave of solder paste (in front in the figure). In this way, the solder paste wets and binds to the inside of the walls 355, 160R and 360 as well.

Figure 3D:
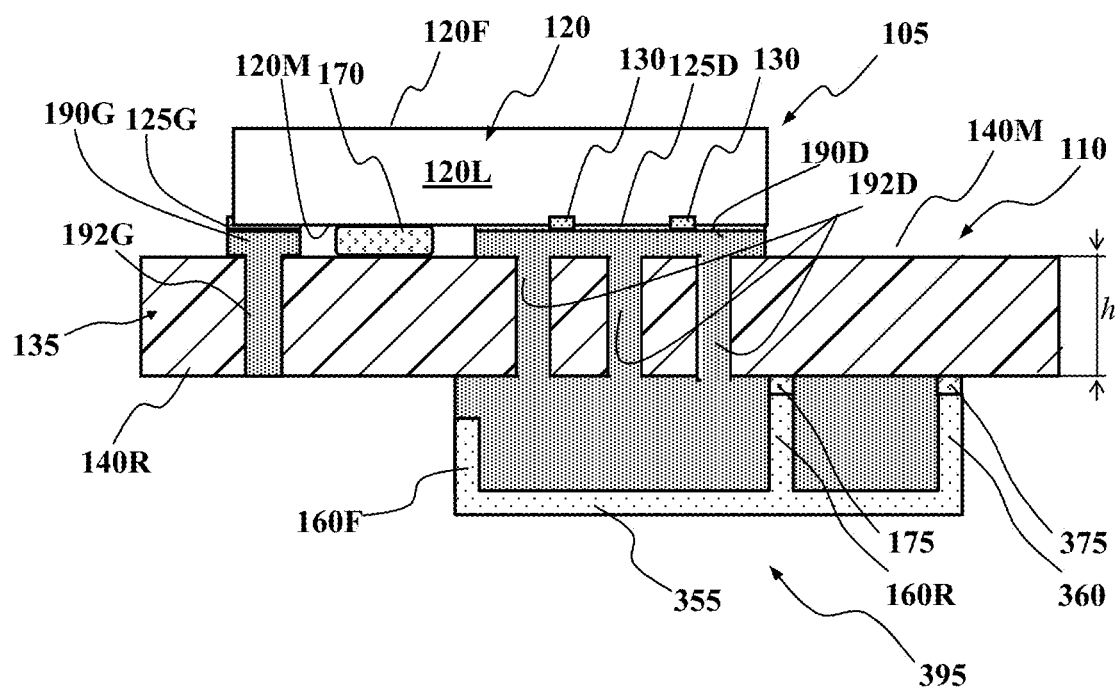

With reference now to FIG. 3D, when the solder paste is cooled, the hardened solder paste inside the cavity 353 fills it (completely or at least substantially—e.g., for 90-95% of its volume), in such a way to form, together with the heat sink precursor 315 and the solder paste solidified in the cavity 353, an extension of the heat sink, indicated as a whole with the reference 395, which is welded in addition to the welding regions 343D also to the welding region 342.

In this case as well, it is possible to make the heat sink precursor (having an "E" like profile) with the portion of the bottom wall 355 which delimits the cavity facing the rows of through holes 150D provided with a comb-shaped profile to facilitate the afflux of solder paste therein (as described with reference to FIGS. 2A-2D).

The solution described above improves the heat dissipation, since the heat sink 395 has a greater extent than it has in the previous cases (always maintaining a particularly compact design of the electronic assembly). This solution is therefore particularly advantageous in the case of an electronic device having a size and a power consumption of considerable magnitude (for example, a footprint equal to or greater than 64 mm$^2$, a thickness in the order of millimeters and a power consumption of the order of Watts or higher).

Naturally, in order to satisfy local and specific requirements, a person skilled in the art may apply to the solution described above many logical and/or physical modifications and alterations. More specifically, although this solution has been described with a certain degree of particularity with reference to one or more embodiments thereof, it should be understood that various omissions, substitutions and changes in the form and details as well as other embodiments are possible. Particularly, different embodiments may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice. In any case, the terms comprising, including, having and containing (and any of their forms) should be understood with an open and non-exhaustive meaning (i.e., not limited to the recited elements), the terms based on, dependent on, according to, function of (and any of their forms) should be understood as a non-exclusive relationship (i.e., with possible further variables involved) and the term a should be understood as one or more elements (unless expressly stated otherwise).

For example, an embodiment proposes a method for producing an electronic assembly. The method comprises the following steps. At least one electronic device is attached to a first main surface of an electronic board with a radiator of each electronic device facing a set of corresponding vias that pass through the electronic board between the first main surface and a second main surface thereof opposite the first main surface. A heat sink precursor for each electronic device is attached to the second main surface of the electronic board, with a cavity of each heat sink precursor facing the corresponding vias. A wave of solder paste is provided that penetrates through at least one opening of each heat sink precursor into the corresponding cavity and from the cavity into the corresponding vias. For each electronic device the solder paste penetrated in the corresponding vias welds the radiator to the vias and the solder paste penetrated into the cavity welds the heat sink precursor to the vias to form a corresponding heat sink.

However, the electronic assembly may comprise a different electronic board (of any type, shape and size), and in particular with vias of any type, shape, size and in any number; similarly, the electronic devices may be in any number and of any type (see below), and in particular with any type, shape and size of the radiator (also separated into multiple parts). Furthermore, the heatsink precursor for each electronic device may be of any type, shape and size (see below), and it may also be separated into multiple parts.

In an embodiment, the step of attaching at least one electronic device to a first main surface comprises attaching at least one surface-mount electronic device to the first main surface. Moreover, the step of providing a wave of solder paste comprises flooding the second main surface facing downwards with the wave of solder paste, in such a way that the solder paste ascends into the vias by capillarity from the second main surface up to overflowing onto the first main surface.

However, nothing prohibits the use of an SMT electronic device of another type (also not of the Micro-Lead type), and more generally of any mounting type—for example, of the through-hole type. Moreover, nothing prevents exploiting a different physical phenomenon (for example, applying a force transversally to the main surfaces to the solder paste) to have it ascend the vias.

In an embodiment, the electronic board comprises a welding region and a further welding region arranged around the vias corresponding to each electronic device on the first main surface and on the second main surface, respectively. The solder paste penetrated in the corresponding vias further welds each radiator to the corresponding welding region and the solder paste penetrated in each cavity further welds the corresponding heat sink precursor to the corresponding further welding region.

However, nothing prevents that the electronic board comprises more than one welding region and/or more than one further welding region arranged around one or more vias corresponding to each electronic device, which may be of any type, shape and size (at the limit, even absent).

In an embodiment, each heat sink precursor comprises a bottom wall and two sidewalls facing to each other extending transversely from the bottom wall. The step of attaching a heat sink precursor for each electronic device to the second main surface comprises attaching a free end of at least one of the sidewalls to the second main surface along a common direction. Furthermore, the step of providing a wave of solder paste comprises providing the wave of solder paste propagating along a propagation direction substantially parallel to the common direction.

However, nothing prevents attaching the free end of the sidewall to the electronic board in any other way (for example, by engaging it with a receptacle formed in the substrate of the electronic board). In any case, nothing prevents forming the heat sink precursor in another way (for example, tray-like with access windows).

In an embodiment, a first one of the sidewalls has a first height from the bottom wall and a second one of the sidewalls has a second height from the bottom wall greater than the first height. The step of attaching a free end of at least one of the sidewalls to the second main surface comprises attaching the free end of the second sidewall to the second main surface, in such a way that the free end of the first sidewall remains separated from the second main surface.

However, nothing prevents forming the sidewalls with different heights, at the limit also equal to each other (so that both of them are attached to the bottom wall).

In an embodiment, the bottom wall comprises a set of slots extending in parallel to the sidewalls from a free edge of the bottom wall between the sidewalls. The step of providing a wave of solder paste comprises providing the wave of solder paste propagating in a direction of propagation directed against the free edge of each heat sink precursor.

However, nothing prevents providing the bottom wall with slots of any shape and size, and in any number (even only one), or with any other opening (for example, window-like). In any case, the possibility of having the back wall that is solid is not excluded.

In an embodiment, the vias are arranged in a plurality of alignments along the propagation direction. The step of attaching a heat sink precursor for each electronic device to the second main surface comprises placing the heat sink precursor with each one of the slots facing the vias of a corresponding one of the alignments.

However, nothing prevents arranging the vias and the slots in any other way (for example, each slot facing the vias of more than one alignment).

In an embodiment, the step of attaching a heat sink precursor for each electronic device to the second main surface comprises attaching the heat sink precursor with at least one further cavity of the heat sink precursor facing another further welding region of the second main surface next to the corresponding vias; in this way, the wave of solder paste penetrates through at least one further opening of the heat sink precursor into each further cavity thereby welding the heat sink precursor to the other further welding region.

However, even in this case it is possible to have any number of further cavities of any type (see below); in addition, also the further welding region may be of any type, shape and size, and also divided into several parts (or entirely absent).

In an embodiment, each heat sink precursor further comprises at least one further sidewall extending transversely from the bottom wall along the common direction. The step of attaching a heat sink precursor for each electronic device to the second main surface comprises attaching a free end of each sidewall to the second main surface.

However, even in this case each further cavity may be of any shape, size and with any type of opening; in any case, nothing prevents attaching a free end of only one or none of the at least one further sidewall to the second main surface.

In general, similar considerations apply if the same solution is implemented with an equivalent method (using similar steps with the same functions of more steps or of portions thereof, removing some steps being not essential, or adding further optional steps); moreover, the steps may be performed in different order, in parallel or overlapped (at least in part).

Another aspect of the solution according to an embodiment proposes an electronic assembly. The electronic assembly comprises an electronic board with at least one set of vias that pass through the electronic board between a first main surface and a second main surface opposite the first main surface. The electronic assembly comprises at least one electronic device attached to the first main surface of the electronic board with a radiator of each electronic device facing a set of corresponding vias. The electronic assembly comprises a heat sink precursor for each electronic device attached to the second main surface of the electronic board with a cavity of each heat sink precursor facing the corresponding vias. The electronic assembly comprises solder paste in the vias that welds each radiator to the corresponding vias, and solder paste in the cavity of each heat sink precursor that welds the heat sink precursor to the corresponding vias thereby forming a corresponding heat sink.

However, the electronic assembly may be of any type (see above).

In general, similar considerations apply if the electronic assembly has a different structure or comprises equivalent components (e.g., of different materials), or it has other operating characteristics. In any case, any component may be separated into several elements, or two or more components may be combined into a single element. It should also be noted that (unless otherwise specified) any interaction between different components generally need not be continuous, and it may be direct or indirect through one or more intermediaries.

What is claimed is:

1. A method for producing an electronic assembly, comprising:
    attaching an electronic device to a first surface of an electronic board including a set of vias passing through the electronic board between the first surface and a second surface opposite the first surface,
    attaching a heat sink precursor to the second surface of the electronic board, the heat sink precursor having a cavity facing the set of vias, and
    providing a wave of solder penetrating through at least one opening of the heat sink precursor into the cavity and penetrating from the cavity into the set of vias, wherein the solder penetrating in the corresponding vias joins the electronic device to the set of vias and the solder penetrating in the cavity joins the heat sink precursor to the vias to form a corresponding heat sink.

2. The method according to claim 1, wherein attaching the electronic device to the first surface comprises:
    attaching a surface-mount electronic device to the first surface, and
    wherein providing the wave of solder comprises flooding the second surface with the wave of solder, the solder penetrating through additional vias by capillarity from the second surface to flow onto the first surface to join the surface-mount electronic device to the electronic board.

3. The method according to claim 1, wherein the electronic board comprises a first welding region and a second welding region arranged around the set of vias, the solder penetrating through the set of vias causing a joining of a radiator of the electronic device to the first joining region and causing a joining of an electrical contact of the electronic device to the second joining region.

4. The method according to claim 1, wherein the heat sink precursor comprises a bottom wall and two sidewalls facing each other and extending transversely from the bottom wall, and wherein attaching the heat sink precursor to the second surface comprises:
    attaching a free end of at least one of the sidewalls to the second surface along a common direction, and
    wherein providing the wave of solder comprises providing the wave of solder propagating along a propagation direction substantially parallel to the common direction.

5. The method according to claim 4, wherein a first one of the sidewalls has a first height from the bottom wall and a second one of the sidewalls has a second height from the bottom wall greater than the first height, and wherein attaching the free end of at least one of the sidewalls to the second surface comprises attaching the free end of the second sidewall to the second surface, the free end of the first sidewall remaining separated from the second surface.

6. The method according to claim 4, wherein the bottom wall comprises a set of slots extending parallel to the sidewalls from a free edge of the bottom wall between the sidewalls, and wherein providing the wave of solder comprises providing the wave of solder propagating in a direction of propagation directed against the free edge of each heat sink precursor.

7. The method according to claim 6, wherein the vias are arranged in a plurality of alignments along the propagation direction, and wherein attaching the heat sink precursor to the second surface comprises placing the heat sink precursor with each one of the slots facing the vias of a corresponding one of the alignments.

8. The method according to claim 1, wherein attaching the heat sink precursor to the second surface comprises:

attaching the heat sink precursor with at least one further cavity of the heat sink precursor facing a joining region of the second main surface adjacent the set of vias, the wave of solder penetrating through at least one further opening of the heat sink precursor into the at least one further cavity thereby joining the heat sink precursor to the joining region.

9. The method according to claim 8, wherein the heat sink precursor comprises a bottom wall and two sidewalls facing each other and extending transversely from the bottom wall and further comprises at least one further sidewall extending transversely from the bottom wall along a common direction, and wherein attaching the heat sink precursor to the second surface comprises attaching a free end of at least two of the sidewalls to the second main surface.

10. A method for producing an electronic assembly, comprising:

adhesively mounting an electronic device to a first surface of an electronic board, said electronic board including a plurality vias passing through the electronic board between the first surface and a second surface opposite the first surface, attaching a heat sink precursor to the second surface of the electronic board opposite the electronic device, the heat sink precursor having a cavity facing at least some of the plurality of vias, and applying a wave of solder against the second surface of the electronic board, said wave of solder passing into the cavity of the heat sink precursor and penetrating from the cavity through the set of vias to join the electronic device to said set of vias, the solder remaining in said cavity to join the heat sink precursor to the set of vias and form a corresponding heat sink.

11. The method of claim 10, wherein the electronic device includes a thermal radiator facing said first surface of the electronic board, the solder penetrating through the set of vias causing the thermal radiator to be joined to said set of vias.

12. The method of claim 10, wherein said electronic board further includes additional vias passing through the electronic board between the first surface and the second surface, and wherein the electronic device further includes an electrical contact facing said first surface of the electronic board, the solder penetrating through the additional vias causing the electrical contact to be joined to said additional vias.

* * * * *

UNITED STATES PATENT AND TRADEMARK OFFICE
CERTIFICATE OF CORRECTION

PATENT NO.       : 9,237,644 B2
APPLICATION NO.  : 14/225625
DATED            : January 12, 2016
INVENTOR(S)      : Cristiano Gianluca Stella et al.

It is certified that error appears in the above-identified patent and that said Letters Patent is hereby corrected as shown below:

In the Claims:

At column 12, claim number 3, line number 34, please replace both instances of [welding] with the word -- joining --.

Signed and Sealed this
Tenth Day of May, 2016

Michelle K. Lee
*Director of the United States Patent and Trademark Office*